United States Patent
Cerny et al.

(10) Patent No.: US 9,626,468 B2
(45) Date of Patent: Apr. 18, 2017

(54) ASSERTION EXTRACTION FROM DESIGN AND ITS SIGNAL TRACES

(71) Applicant: Synopsys, Inc., Mountain View, CA (US)

(72) Inventors: Eduard Cerny, Worcester, MA (US); Diganchal Chakraborty, Bangalore (IN); Saptarshi Ghosh, West Bengal (IN); Yogesh Pandey, Bangalore (IN)

(73) Assignee: SYNOPSYS, INC., Mountain View, CA (US)

( * ) Notice: Subject to any disclaimer, the term of this patent is extended or adjusted under 35 U.S.C. 154(b) by 368 days.

(21) Appl. No.: 14/192,809

(22) Filed: Feb. 27, 2014

(65) Prior Publication Data

US 2015/0242541 A1    Aug. 27, 2015

(51) Int. Cl.
  *G06F 17/50* (2006.01)

(52) U.S. Cl.
  CPC ........ *G06F 17/504* (2013.01); *G06F 17/5045* (2013.01)

(58) Field of Classification Search
  USPC ........................................ 716/106
  See application file for complete search history.

(56) References Cited

U.S. PATENT DOCUMENTS

| | | |
|---|---|---|
| 6,609,229 B1 | 8/2003 | Ly et al. |
| 7,313,772 B2 | 12/2007 | Hekmatpour et al. |
| 7,926,020 B1 | 4/2011 | Lu et al. |
| 2006/0190882 A1* | 8/2006 | Fong .................. G06F 17/5031 716/102 |
| 2008/0104556 A1* | 5/2008 | Yamada ............. G06F 17/5022 716/102 |
| 2010/0088257 A1 | 4/2010 | Lu et al. |
| 2011/0119655 A1* | 5/2011 | Matsuda .............. G06F 17/504 717/126 |

(Continued)

OTHER PUBLICATIONS

Charu Aggarwal, Genadi Osowiecki, and Shobha Subramanian. "A Practical Guide to Deploying Assertions in RTL." Texas Instruments, Presented at Cadence Designer Network Live, Silicon Valley, CA (2007).

(Continued)

*Primary Examiner* — Mohammed Alam
(74) *Attorney, Agent, or Firm* — Alston & Bird LLP

(57) ABSTRACT

Groups of signals in an electronic design for which interesting assertions, such as assert, assume and cover properties, can be generated are identified. A sliding temporal window of fixed depth is used to sample unique present and past value combinations of signals in the signals groups generated by one or more simulations or emulations. The values of signals in the signal groups are organized into truth tables. Minimal functional relations are extracted from the truth tables, using techniques similar to those for synthesis of partial finite memory machines from traces, and used to generate assertions. The assertions are filtered using a cost function and pertinence heuristics, and a formal verification tool used to prune unreachable properties and generate traces for reachable cover properties. Syntactically correct assert, assume and cover property statements for the generated properties are instantiated and packaged into a file suitable for further simulation or emulation or formal verification.

39 Claims, 10 Drawing Sheets

(56) References Cited

U.S. PATENT DOCUMENTS

| | | | |
|---|---|---|---|
| 2011/0225559 A1* | 9/2011 | Nishide | G06F 11/2257 716/106 |
| 2013/0019216 A1* | 1/2013 | Vasudevan | G06F 17/504 716/106 |
| 2014/0250414 A1* | 9/2014 | Lu | G06F 17/5022 716/107 |
| 2015/0242541 A1* | 8/2015 | Cerny | G06F 17/504 716/106 |

OTHER PUBLICATIONS

Svoboda, Antonin. "Synthesis of logical systems of given activity." Electronic Computers, IEEE Transactions on 6 (1963): 904-910.

Jasper Design Automation. "JasperGold Property Synthesis Apps—Property Synthesis Throughout the Design Flow for Application in Formal Verification, Simulation and Emulation." Mountain View, CA (2012).

Jasper Design Automation. "JasperGold Apps—Interoperable Application-Specific Solutions for Formal Verification Throughout the Design Flow." Mountain View, CA (2012).

Vasudevan, Shobha, et al. "Goldmine: Automatic assertion generation using data mining and static analysis." Design, Automation & Test in Europe Conference & Exhibition (DATE), 2010. IEEE, 2010.

Silva, Wesley, et al. "Automatic property generation for formal verification applied to HDL-based design of an on-board computer for space applications." Test Workshop (LATW), 2013 14th Latin American. IEEE, 2013.

Liu, Lingyi, et al. "A technique for test coverage closure using goldmine." Computer-Aided Design of Integrated Circuits and Systems, IEEE Transactions on 31.5 (2012): 790-803.

Hertz, Samuel, David Sheridan, and Shobha Vasudevan. "Mining hardware assertions with guidance from static analysis." Computer-Aided Design of Integrated Circuits and Systems, IEEE Transactions on 32.6 (2013): 952-965.

Bertasi, Michele, Giuseppe Di Guglielmo, and Graziano Pravadelli. "Automatic generation of compact formal properties for effective error detection." Hardware/Software Codesign and System Synthesis (Codes+ ISSS), 2013 International Conference on. IEEE, 2013.

Sheridan, David, et al. "A Coverage Guided Mining Approach for Automatic Generation of Succinct Assertions." VLSI Design and 2014 13th International Conference on Embedded Systems, 2014 27th International Conference on. IEEE, 2014.

Liu, Lingyi, et al. "Diagnosing root causes of system level performance violations." Proceedings of the International Conference on Computer-Aided Design. IEEE Press, 2013.

Lin, David, and Subhasish Mitra. "QED post-silicon validation and debug: Frequently asked questions." Design Automation Conference (ASP-DAC), 2014 19th Asia and South Pacific. IEEE, 2014.

El Mandouh, Eman, and Amr G. Wassal. "Automatic generation of hardware design properties from simulation traces." Circuits and Systems (ISCAS), 2012 IEEE International Symposium on. IEEE, 2012.

Liu, Lingyi, Chen-Hsuan Lin, and Shobha Vasudevan. "Word level feature discovery to enhance quality of assertion mining." Proceedings of the International Conference on Computer-Aided Design. ACM, 2012.

* cited by examiner

*Table*: uniquefied table of signal values of signal group SG
*IS*: set of independent variables of SG
*NIndep*: number of variables in IS
*FuncRel*: set of functional sub-relations extracted from *Table*
*RCost*: cost function used to evaluate the cost of a functional relation
*Vars*: set of subsets of independent variables from IS

900

```
For (n=NIndep-1; n>=1; n--) {
  Vars = all combinations of n variables from IS
  For each element el in Vars do {
    AbsTable = Abstract el variables in Table
    Extract functional sub-relations from AbsTable and insert in FuncRel
  }
}
Given RCost select minimal subset of functional relations from FuncRel that cover Table.
```

ASSERTION EXTRACTION FROM DESIGN AND ITS SIGNAL TRACES

FIELD OF ART

This application relates generally to semiconductor circuit design and more particularly to generation of assertions from a design for an electronic circuit.

BACKGROUND

Design of modern semiconductors or other electronic devices is extremely complex. A business' success depends on implementing an electronic design process which produces functionally correct hardware efficiently and at the lowest cost. Such a design process depends on design verification techniques capable of determining whether the function of a proposed circuit design conforms to a specification, and extensive analysis and verification methods are required to ensure compliance. A circuit's ability to successfully meet a specification ensures the proper operation of both the circuit in question and the system as a whole. In order to perform such verification, various simulation and other verification tools are used.

Traditional verification methods are based on test benches. Test benches are a verification technique that functions by applying sequences of known test vectors to the circuit inputs and monitoring the results at the circuit outputs. If the expected output values are discovered, the circuit is thought to function properly. However, the test bench approach, along with many currently implemented verification techniques, has become less efficient at finding design errors, both because of increased test duration and other difficulties inherent in verifying complex modern circuit designs. Further, current methods do not scale to large electronic systems comprising perhaps hundreds of millions of devices. Since the detailed evaluation of circuits—especially large circuits—using hand generated test vectors is too difficult and time consuming to be viable, circuit designers have employed other approaches to verification that maximize coverage.

One such technique involves the use of assertions. Assertions provide a very effective means for detecting and localizing design errors, as well as a means for detecting unexercised design areas. At least one type of assertion is a statement about the behavior of the design that, if false, indicates an error in the design. Assertions are usually written by the designer or by verification personnel, however, the writing and implementation of assertions require skills that are not always easy to acquire and apply. Some barriers that can discourage designers from effectively writing assertions for their design include lack of interest in learning about the effectiveness of assertions, a lack of knowledge of an assertion language, a different conceptual view of the design, and tight deadlines.

Assertions can be used with pseudo-random test vectors to help verify a circuit. The pseudo-random test vectors are sometimes constrained by assertions, in which case these assertions are referred to as constraints or assumptions. These constraints or assumptions form a large element of constrained random verification, a technique used to gauge the functionality of complex modern circuit arrangements. As before, this verification approach is based on a test bench. The test bench generates a random (or pseudo-random) set of test vectors, which can represent a much wider range of values than possible using the fixed sequences previously employed. However, arbitrary, random values may not properly stimulate a design in situ. Thus, the random values are constrained to encapsulate the context of the system or subsystem being tested. The test vectors can then be used to stimulate the circuit during simulation and the outputs can be tested against the assertions to verify proper operation of the circuit. These assumptions can often be used in formal verification model checking and elsewhere.

SUMMARY

Groups of signals in an electronic design are identified for which interesting assertions, such as assert, assume and cover properties, can be generated. A sliding temporal window of fixed depth is used to sample unique present and past value combinations of signals in the signals groups generated by one or more simulations and organized into truth tables. Minimal functional sub-relations are extracted from the truth tables, using techniques that extend methods for synthesizing finite memory machines from traces, and then used to generate assertions. The assertions are filtered using a cost function and pertinence heuristics and a formal verification tool is used to prune unreachable properties and generate traces for reachable cover properties. Syntactically correct assert, assume and cover property statements for the generated properties are instantiated and packaged into a file suitable for further simulation or formal verification.

A computer-implemented method for assertion generation is disclosed comprising: obtaining a design description for a circuit; identifying groups of signals within the circuit; simulating the circuit, including the groups of signals, across multiple tests; dumping signal data, from the groups of signals, based on the simulating; extracting relationships between signals based on the signal data that was dumped; and generating a plurality of assertions for a plurality of signals, from the groups of signals, based on the relationships which were extracted. The method can include merging the signal data from the multiple tests and the extracting can be further based on the merging of the signal data. The plurality of assertions can be based on operation of the circuit across multiple clock cycles. The dumping of signal data can provide uniquified information on the signal data. The signal data can be dumped in raw form, e.g. in VCD files, and then a sliding window can be used to generate the uniquified truth tables. In some embodiments, the data is dumped in the tables already in uniquified form during the simulation.

In embodiments, a computer system for assertion generation comprises: a memory which stores instructions; one or more processors coupled to the memory wherein the one or more processors are configured to: obtain a design description for a circuit; identify groups of signals within the circuit; simulate the circuit, including the groups of signals, across multiple tests; dump signal data, from the groups of signals, based on the simulating; extract relationships between signals based on the signal data that was dumped; and generate a plurality of assertions for a plurality of signals, from the groups of signals, based on the relationships which were extracted. In some embodiments, a computer program product embodied in a non-transitory computer readable medium for assertion generation comprises: code for obtaining a design description for a circuit; code for identifying groups of signals within the circuit; code for simulating the circuit, including the groups of signals, across multiple tests; code for dumping signal data, from the groups of signals, based on the simulating; code for extracting relationships between signals based on the signal data that was dumped; and code for generating a plurality of assertions for a plurality of signals, from the groups of signals, based on the relationships which were extracted.

Various features, aspects, and advantages of various embodiments will become more apparent from the following further description.

BRIEF DESCRIPTION OF THE DRAWINGS

The following detailed description of certain embodiments may be understood by reference to the following figures wherein:

FIG. 9 shows code description of abstraction.

DETAILED DESCRIPTION

Configuration Overview

Figure 1:
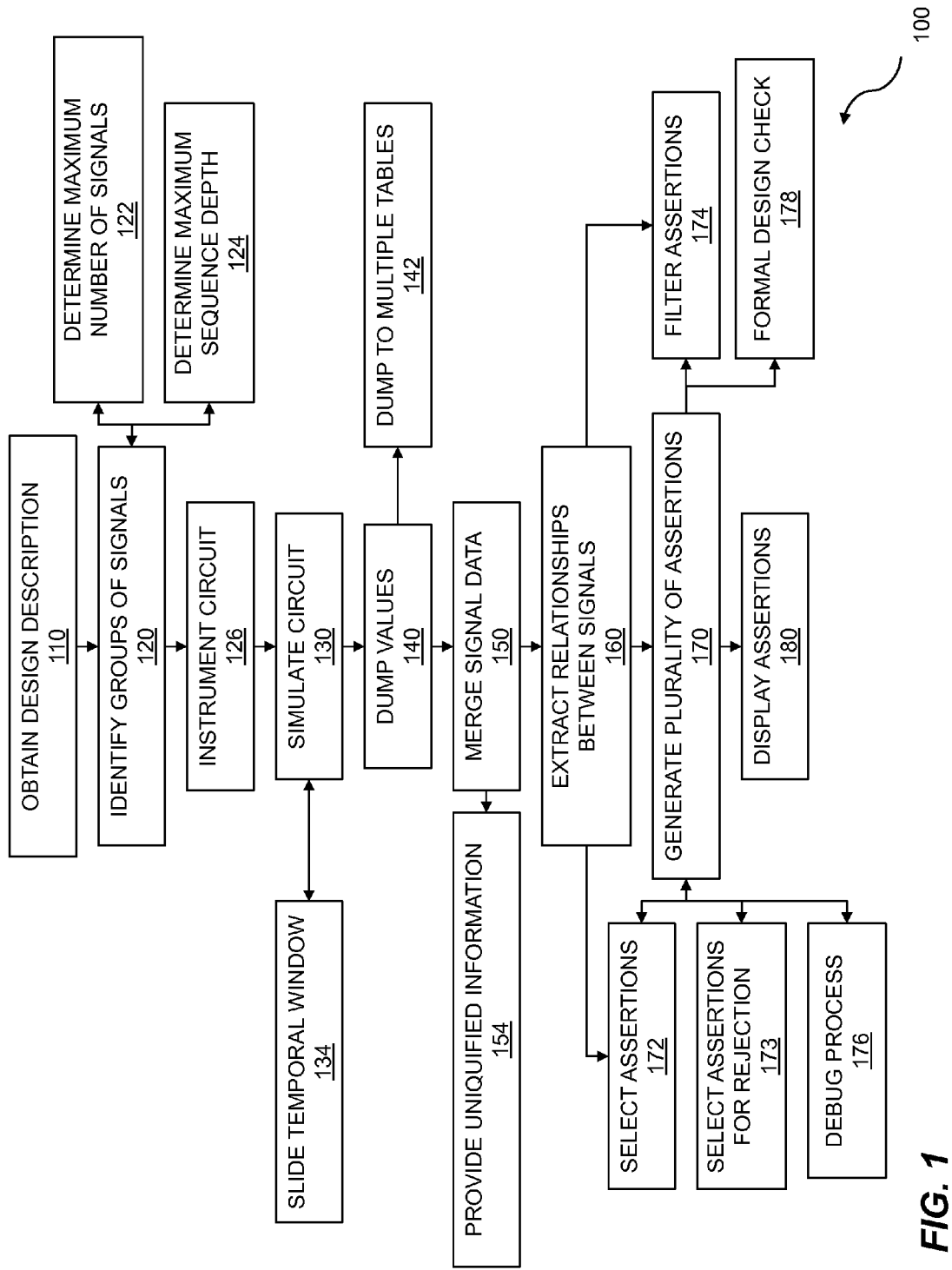
FIG. 1 is a flow diagram for assertion generation.

Assertions provide a very effective way to detect and localize design errors, and to detect unexercised design areas. Techniques for generation of assertions directly from the design with minimal effort from the designer are described herein. Assertions, as the term is used herein and in the claims, can refer to temporal assertions, temporal constraints, or covers. Certain forms of assertions are formulated about the behavior of a digital design by observing the results of the signals within a design over time as the design undergoes simulation. Once a set of assertions has been machine generated, a user can review them and select appropriate assertions. Techniques for determining and/or generating appropriate assertions using heuristics and model checking are described, so that the user does not need to sort through a large number of irrelevant assertions.

A design commonly contains thousands, or even millions, of signals; therefore, it is impractical to search in the signal value traces for arbitrary temporal relations over values of any non-trivial subset of the signals. In the disclosed concept, signal analysis using assertions proceeds in several phases. The first phase is compilation. This involves static analysis of the design to identify groups of signals containing potentially interesting assertions. The design and simulation are instrumented during this phase to allow the values of the signals of interest to be dumped into a database. The second phase is the simulation. Signal values from the instrumented nodes of the design are dumped into a database during this phase. The third phase is assertion generation. Databases from several tests are merged and converted into truth tables. Minimal functional relations that can be converted to properties used for assertions are then extracted from those truth tables. The assertions are then filtered and categorized using "perceived quality" heuristics, and a formal tool such as a model checker is used to remove unreachable covers and invalid assertions.

The final set of assertions for each module of interest is categorized as either black-box properties on interfaces (temporal constraints, temporal assertions, or coverage), or white-box properties involving internal signals (temporal assertions, or coverage). The properties are presented to the user through a user interface, such as a web page presented in a web browser. There, the user can invoke a view of the portions of the source code that involve signals in the support of the property; mark and unmark properties as uninteresting, with an uninteresting mark used to move properties to a "drop" category; obtain frequency of activation in the simulation traces, and view the trace to the primary inputs that lead to the coverage of a specific node. In some embodiments, the assertions are instantiated using the appropriate SystemVerilog assertion directives such as "assert property," "assume property," and "cover property," and encapsulated in files that are included in either a module or a vunit bound to the corresponding design module(s). Any other assertions language that supports these verification directives can be used, such as PSL. The three phases are now discussed in more detail using one embodiment and specific examples.

Phase 1—Compilation

The first phase, compilation, includes static analysis and design instrumentation. For static analysis, the user specifies one or more modules from within the design under consideration for which assertion generation is requested. The design is compiled and the modules translated to a word-level netlist. The netlist is abstracted into a directed signal dependency graph DG=(V, E), where V={Primary Inputs (PI), Primary Outputs (PO), Clocked Registers (R)}. Each graph includes attributes such as the signal name, clocks that sample the signal, the reset signal, and the bit and part select signals. The directed edges indicate the use relations: E={ (v1, v2), v1, v2 in V|v2 depends on v1 in netlist}.

DG is partitioned into primitive regions or signal groups such that a primitive group pg consists of one "dependent" signal ds from PO or R and a set of "independent" signals IS={is in V|ds depends on is in DG one clock cycle}. Primitive groups are merged using sequential concatenation and union operations to form larger signal groups. These larger groups define sets of signals for which assertions are generated. A sequential merge replaces one or more independent signals is in a signal group with dependent signals of another group such that is==ds. This forms a signal group that is deeper and has more independent signals. Both the maximal sequential depth SD and the maximum number of independent signals NIndep in the resulting group are bounded to reduce the complexity of the signal value analysis. Heuristics such as fan-in and fan-out degrees are used to select which independent signals should be kept or dropped. A union merge joins two or more signals groups to form a "union" group in which the dependent signals represent the union of the dependent signals of the merged groups. Similarly, the independent signals for the union group are a union of the independent signals of the merged groups. Again the number of the independent signals is limited using heuristics, as was the case in the sequential merge. Furthermore, for the embodiment described, two groups are union merged only if they share at least two independent signals. This restriction on merging avoids generating properties on signals from unrelated sections of the design.

Due to the limits on the number of independent signals in a group, the resulting groups overlap in some cases, resulting in more than one group having some of the same dependent and independent signals. Some signal groups target state machines that were identified during the analysis phase. Such groups have distinct dependent signals that are predicates on the state values. The set of independent signals contains predicates on the present state value and control signals in the clock of interest for the next-state predicate. These groups allow extracting both statically and from the simulation data the state transitions of the finite state machines. The module names, signal groups, reset signals, and various other attributes are stored in a configuration file in xml format in at least some embodiments.

During design instrumentation, statements are added to the design to allow signals to be monitored during simulation. Once the signal groups are identified and their description stored in the configuration file, the design is instrumented to dump the signal values for each signal groups into a database during simulation. The same effect can be achieved by post processing a VCD or any other type of signal dump file. In some embodiments, the signal dumping is instrumented a way that effectively stores information on signal changes to reduce simulation overhead.

Phase 2—Simulation

During the second phase, simulation or emulation, various techniques can be used to exercise the design, including, but not limited to, hand generated vectors, random or pseudo-random vectors, constraint-based vectors, vectors generated from other simulations of the module under simulation, or vectors generated by simulation of other modules of the design or other designs. The signal values, generated during the simulation and captured by the instrumentation, are dumped into a database file. In at least one embodiment, a database file consists of tables of value vectors, with one table for each signal group. The vector signals are the present values and all past values up to a pre-specified sequential depth (SD) of the signal group. In some embodiments, only unique occurrences of combinations of signal values are stored. Thus, the table is an image of the relation that exists between the dependent and independent signals with memory depth bounded by the constraint of SD. In some embodiments, there is one database file for each simulation run. As the temporal depth of the sliding window increases, so does the size of the table in general. For practical reasons, some embodiments may limit the maximal depth to SD=3 or 4 clock cycles. This allows for generating temporal assertions that span up to SD clock cycles.

Phase 3—Assertion Processing

During assertion processing, the third phase, databases are merged and properties extracted, filtered, and categorized. To merge databases, several simulations can be performed and the resulting database tables combined or merged, provided that the modules of interest, and thus the configuration file, do not change. The merging is a set union of the individual tables, the result of which is again uniquified so that each vector of values appears only once in the resulting table. The resulting table is an image of the relation between signal values in the signal group across all tests.

To extract properties, the signal values in the merged table for each signal group are analyzed to extract temporal relations between the signals values. The relations are restricted to exist within the sequential depth SD of the signal group as identified in the analysis phase. In one embodiment, SYSTEMVERILOG™ is used, but PSL™ or any other temporal logic formulation can be used in other embodiments. Note that in at least some cases, the same effect can be achieved using either SystemVerilog assertion properties or SystemVerilog cover properties. Several type of assertions can be generated, including the following:

SystemVerilog assertion (SVA) properties that relate independent signals to dependent ones by following the causal relations in the dependency graph. This type of assertion has the form Sequence1|=>Sequence2, where sequence 1 is formed over the independent and dependent signals from the group, and sequence 2 is formed over the dependent signals. Both can contain first-order predicates involving variables that are multi-bit vectors.

SVA properties that represent potentially non-causal invariants over the signals in the group. The form taken by these assertions is Sequence|→Boolean. Sequence is similar to Sequence1 above, but the temporal span of Sequence is less than the minimum distance to the dependent signals. Boolean can refer to any Boolean equation using any of the dependent variables of the group. These assertions often characterize the behavior of the tests, especially if expressed in terms of primary inputs and outputs. Thus these assertion can represent temporal constraints on the primary input signal values.

SVA properties of the form $onehot0, meaning that at most one bit of a concatenation of scalar signals or vector signal is high.

SystemVerilog cover properties on signals that were detected as constant in the trace or conditionally constant on values of other signals.

The extraction of properties from a uniquified table relies on identifying minimal functional sub-relations (also can be seen as partial finite-memory machines) between the dependent variable values and the present and past values of the independent variables and the past values of the dependent variables. Each such functional sub-relation can represent one extracted property of the design as induced by the tests and the structure of the design. The search for the partial machines proceeds by existentially abstracting a subset of independent variables from the table followed by identifying functional sub-relations from the resulting abstracted table.

An entire merged table describes the behavior of a module, but by choosing appropriate variables and checking the table coverage, the behavior can be expressed in a more compact way using reduced number of SVA properties. For each signal group that has a uniquified table associated with it, a complete set of functional sub-relations can be extracted and a covering problem solved, guided by a cost function. Since the complexity of the procedure grows exponentially with the number of variables allowed in a sub-relation after abstraction, the maximum number of variables that appear in such a relation can be limited, in addition to the previously mentioned limiting of the sequential depth. This means 100% coverage of the original table may not be achieved in all cases. Further, SVA related properties that involve more than three or four variables over several clock cycles can become much more difficult to understand by the design and verification engineers and thus these automatic assertion filtering techniques can be crucial.

The result of the extraction is a set of functional relations that represent potential properties of the design and test bench. These can be filtered by additional heuristics, and categorized as assert, assume, or cover SystemVerilog properties. Various types of filters can be used in various embodiments to select properties. As mentioned earlier, filtering can occur during the compilation phase by selecting groups of signals. The selection can be done differently depending on the initial category of the property. A signal group for a SystemVerilog assume property can be guided by the need to have the primary input signals of the module involved and evidencing some common successor in the dependency graph. In addition, the user can provide a file with sets of signals, or port groups, to guide this selection. In other instances, the selection can be made to obtain as rich a set of assumptions as possible. In embodiments, the filtering can filter out uninteresting assertions by means of a cost function and formal tools.

A group for a SystemVerilog assert property can be selected to avoid generating trivial assertions that simply follow direct assignments from within a single synchronous process. For example, signals can be selected for the group that have no direct dependency between them, but have a common predecessor two or more clock cycles earlier in the dependency graph. A $onehot0 and $onehot check can be used for generated groups that have more than one dependent signal, or if a vector variable with assignments using constants is detected. Typically, the group is selected to obtain relations between the independent variables and the dependent ones.

Cover properties are not targeted at the design analysis stage in most embodiments. SystemVerilog cover properties can be generated as byproducts of the analysis of the extracted relations from the uniquified tables of the signal groups.

A second type of filter is applied using the cost function RCost during the processing of the tables. In at least one embodiment, the RCost function is a linear weighted function described as RCost=wf/fanout+wv*(1−1/variable_type)+wc*(1−coverage)+wt/Nclock cycles+wp*(1−1/Npropositions), where fanout is the sum of an out degree of each node in the extracted relation; variable_type is an integer assigned predicate on internal signal, predicate on input and output port, internal scalar, and primary input and output port; coverage is the fraction of the rows in the table covered by the relation; Nclock cycles is the temporal span of the relation; and Npropositions is the number of variables and predicates on vectors contained in the relation. After the set of abstracted relations is generated, they are sorted by increasing cost. Relations are selected for inclusion in the potential set by starting from those with lowest cost. If a relation is selected, the coverage component of the remaining relations is recomputed. If the cost of a relation reaches above a threshold (TH), the relation is dropped. The threshold can be a system constant determined from running experiments on several designs. In addition, TH and the weights can be changed by an experienced user in some embodiments. The cost function can be easily extended to include other factors, i.e. related to the form of the expressions.

A third type of filter detects constant signals and identifies them as constant SystemVerilog cover properties or as SystemVerilog assume properties if found on primary inputs. Each relation is also examined in the context of the table from which it was abstracted to detect pairs of signals from the independent side of the relation, which always has the same pair of values in the table. A partial cover property can be generated such that one of the two signals is complemented. In some embodiments, a condition for the cover property to be accepted is that the two signals share a common successor in the dependency graph. Such a cover property indicates that this value combination has not occurred in the simulation and might be of interest to enhance the set of tests, provided that the cover passes the subsequent filter.

A fourth type filter uses a model checker to eliminate properties. With this type of filter, unreachable partial covers are dropped from an unconstrained top module because the test bench cannot generate any input sequence adequate to satisfy them. Assert properties that fail may also be dropped from the unconstrained top module. This means that only those assertions that hold for the design, regardless the behavior of the test bench, are true assertions of the design and are kept. Alternately, failed assertions may be converted to covers using the dualized property where the consequent of the implication is negated and the implication is changed to concatenation.

A fifth type of filter examines the frequency $F_{sat}$ for satisfaction of the consequent of the extracted property in the simulation traces. $F_{sat}$ is computed as the percentage of times in which the consequent is satisfied in the traces. If $F_{sat}$ is greater than a threshold $TH_{sat}$ the property is dropped as "uninteresting" because it can be satisfied by many values in the simulation. For Boolean implications, e.g., A|→B, the frequency of satisfaction of the negated antecedent !A is also considered. If both !A and B have high $F_{sat}$ values, then the property is dropped. Constant values on primary input ports are kept as assume properties, while complemented constant values on internal signals are kept as covers if there is no connection to a constant primary input.

The properties, categorized as assume, assert and cover properties, can then be presented to the user for review. The category of the property can then be changed or the property can be marked as uninteresting and dropped. The actual SYSTEMVERILOG™ include files which are subsequently updated and are ready for use in simulation or formal verification by the user.

FURTHER DETAILS

FIG. 1 is a flow diagram for assertion generation. The flow 100 shows a computer-implemented method for assertion generation and includes obtaining a design description 110 for a circuit. The design description can be obtained by any method, but is read from a computer readable medium in some embodiments. In other embodiments, the design description is obtained by user entry, or from the output of another electronic design automation (EDA) tool. The design description can take any form or be in any format, but in some embodiments the design description is a hardware description written using a hardware description language such as VERILOG™, VHDL™, SYSTEMVERILOG™, or SYSTEMC™.

The design description includes signals, which can represent physical wires in the hardware design or can represent values passed between various parts of the design that have no direct hardware equivalent, but can be used for verification or debugging purposes. The signals include primary inputs, primary outputs, and clocked registers. The flow 100 includes identifying groups of signals 120 within the circuit. The groups can be selected by any method, but in some embodiments, the groups are selected in a way that allows interesting assert and cover properties to be generated. In some embodiments, the groups of signals are identified using static analysis.

In one embodiment, primitive groups are created that have a single dependent signal and a set of independent signals sufficient to determine the value of the dependent signal over time. The dependent signal is selected from the primary outputs or the clocked registers. Once the primitive groups are defined, they are merged into larger groups. One way of merging groups into larger groups is to merge sequential primitive groups by merging a downstream primitive group with upstream primitive groups where the dependent signal of each of the upstream primitive groups drives an independent signal of the downstream primitive group. Another way of merging groups is to merge two primitive groups that share two or more independent signals. The merged groups can be merged with additional primitive groups or other merged groups. A maximum sequential depth of clocks required for a value to propagate from an independent input of a merged group to a dependent output of the merged group is preset using various techniques, in some embodiments. In some embodiments, a maximum number for signals within the groups of signals is determined 122, wherein the maximum number of signals is used to limit the simulating. Such limitations help to reduce the complexity of the later signal value analysis.

The circuit, or design description, is instrumented 126. Instrumenting the circuit allows the values of the signals included in the groups of signals to be accessed during simulation. The instrumenting can be done in any way, but is dependent upon the language used for the design description and the simulator program used. The flow 100 continues by simulating the circuit 130, including the groups of signals, across multiple tests. Any simulator can be used, depending on the embodiment, but a digital, state-based, functional simulator, such as the Synopsys VCS® functional verification solution, is used in at least some embodiments. The flow 100 can further include determining a maximum sequential depth 124 for the simulating and sliding a temporal window 134 across the groups of signals during the simulating, where the temporal window is less than or equal to the maximum sequential depth. As each simulation proceeds, the sliding temporal window generates information about the current state of the signals in the groups as well as the state of the signals in the group for previous cycles up to the depth of the temporal window.

The flow 100 includes dumping signal data 140, from the groups of signals, based on the simulating. The dumping of signal data from the multiple tests can result in multiple tables 142. In some embodiments, the signal data from a single test can be dumped into multiple tables 142. As an example of data from a single test dumped into multiple tables, a separate table can be used for each group of signals, where the width of the table is equal to the length of the temporal window. In this case, dumping means to transfer data from the simulator to another storage location, such as a file stored on a computer readable medium. Depending on the embodiments, the table can be individual files, records in a database, different sections of a common file, or any other organizational system that is accessible by a processor for further analysis.

The flow 100 continues by merging the signal data from the multiple tests 150. In some embodiments, the merging of the signal data includes merging data from the multiple tables into a single table by performing a set union merge. Redundant signal values are removed so that any value combination for the signals in the group appears only once in the merged table. In some cases, a table can have redundant information generated by the simulator, or two tables that are merged into a single table can contain redundant data. In some embodiments, the redundant data is removed to create uniquified information. So, the dumping of signal data can provide uniquified information 154 on the signal data and/or the uniquification procedure can remove redundancy from the signal data.

Uniquifying the data means that duplicate logical states are removed, and/or that signals with different names that refer to the same physical signal are collapsed into a single name. In embodiments, the duplicate logical states can be removed during data dumping or during table merging. When signals with different names refer to the same physical signal, one of the names can be substituted for the other, or a new common name can be substituted for both of the names in the database.

The flow 100 includes extracting relationships between signals 160 based on the merging of the signal data. The relationships can include a minimal function relationship for one or more of truth tables. In some embodiments, the relationships that are extracted are based on a cost function calculated from a number of variables in the relationships and predicates on vectors within the relationships. Other techniques can be used in other embodiments. One other technique is variable extraction where a dependent variable is found to not have a dependency on one or more independent variables for at least a particular pattern of the other independent variables. Another technique is partial constant identification where two or more equations that together define a constant condition are identified.

The flow 100 includes generating a plurality of assertions 170 for a plurality of signals from the groups of signals, based on the relationships which were extracted, where the assertions are based on operation of the circuit across multiple clock cycles. The assertions can be based on value traces for the groups of signals within the circuit. The assertions can include temporal assertions, temporal constraints, and temporal covers. In at least one embodiment, a temporal assertion is defined by a SystemVerilog assert property, a temporal constraint can be defined by a System-Verilog assume property, and a temporal cover can be defined by a SystemVerilog cover property. The temporal assertions can include statements describing required relations between values of different signals that the design should satisfy over multiple clock cycles. The temporal assumptions can include constraints expressing use environment limitations for interfaces of the design. The temporal covers can include a measure of the quality of verification for the design by identifying the portions of the design that are exercised.

In some embodiments, a plurality of assertions is selected 172 based on the relationships which were extracted. The plurality of assertions can be selected to create an optimized set of asserts to cover the truth table. In some embodiments, a user selects assertions. In some embodiments, assertions are machine selected. Some embodiments also select one or more of the plurality of assertions for rejection 173. The selecting-for-rejection process is performed by a user in some embodiments, but in embodiments, other techniques are used to select for rejection such as selecting redundant assertions. In some embodiments the assertions are filtered 174. The results of the filtering can be used to select assertions to preserve or reject. Different types of filtering can be used by different embodiments, including group selection in the compilation phase, using a cost function, identifying constants, using a model checker to eliminate properties, and using a frequency of satisfaction to drop properties that are satisfied too often.

The flow 100 can further comprise using the assertions in a debugging process for the circuit 176. The results of the assertion can be used during debugging to determine if the circuit is operating properly, and/or to determine where a fault or design error is located. In some embodiments, the assertions are used in a formal design check 178. The formal design check can comprise part of a verification process. The flow 100 can further comprise displaying the plurality of assertions 180. Depending on the embodiment, all the generated assertions can be displayed, only the selected assertions can be displayed, only the rejected assertions can be displayed, or any other combination of assertions can be displayed.

Figure 2:
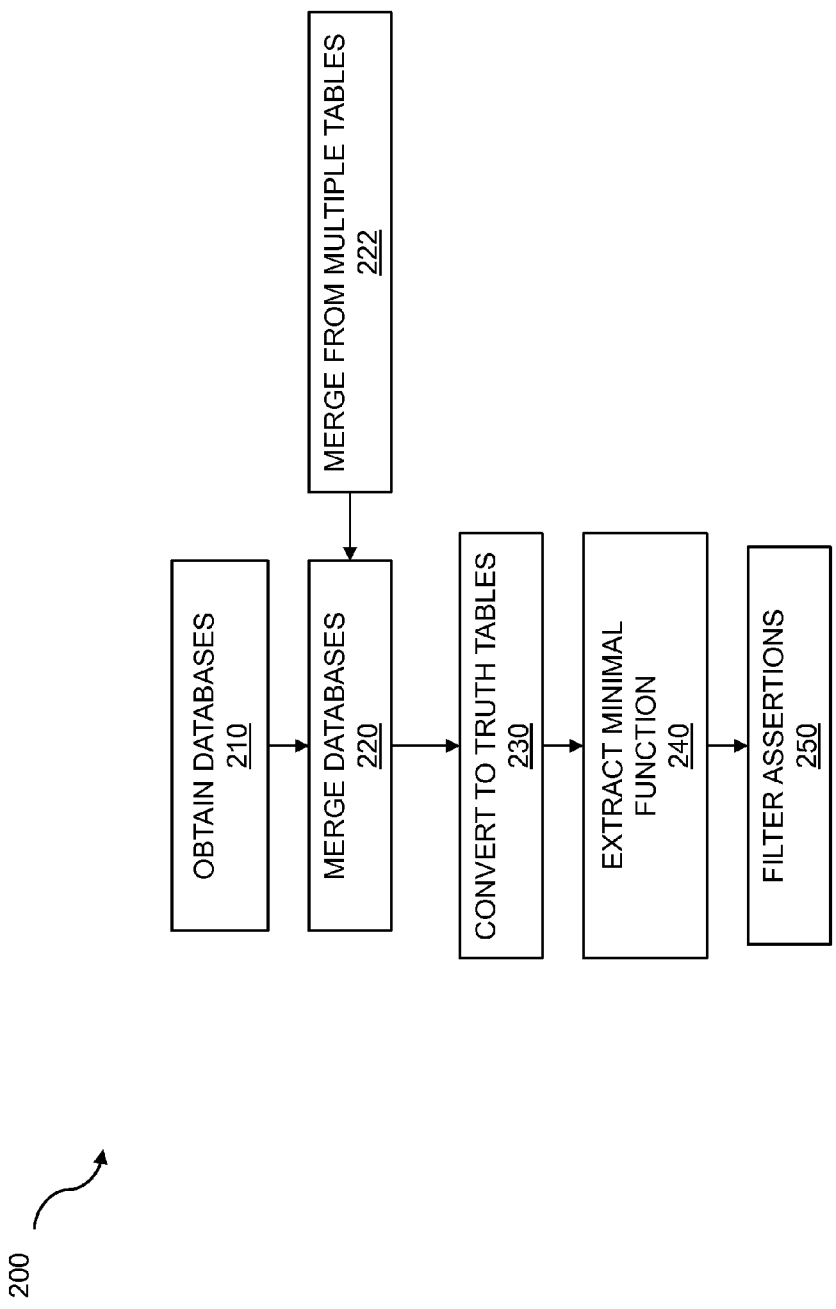
FIG. 2 is a flow diagram for merging.

FIG. 2 is a flow diagram for merging. The flow 200 includes obtaining databases 210 containing groups of signals. Tables can contain signal values for the signal groups. The groups of signals can include primitive groups having a single dependent signal that is an output or the state of a clocked register, and a set of independent signals that have an impact on the value of the dependent signal. A primitive group can have a sequential depth of 1, meaning that it takes no more than one clock cycle for a value of an independent signal to have an effect on the dependent signal. The groups of signals can include merged groups formed from two or more primitive groups.

The flow 200 continues by merging databases from multiple tests 220 into a single database. The merging can include merging multiple tables 222 into a single table. Any combination of groups of signals can be merged depending on the embodiment. Merging can be a set union of values such that each vector of values appears once in a resulting table. That table is an image of the relation between signal values in the signal group across multiple tests.

In embodiments, the tables include simulation results. In such embodiments, the simulation results from the tables are converted to truth tables 230. A sliding temporal window can be slid through the simulation results to generate a truth table with a sequential depth equal to the width of the temporal window. In at least one embodiment, the temporal window is one, two, or three clocks wide. The truth tables can then be analyzed to extract minimal functional sub-relations 240 to represent the truth table in part or as a whole. In some cases, the extracted function may not provide 100% coverage of the truth table. The extracted functional sub-relation can be described as one or more assertions. The assertions are filtered 250 based on the extracting of the minimal functional relationship in some embodiments. Filtering can be done by any method, depending on the embodiment, but the filtering in some embodiments is based on a common predecessor for multiple signals from the plurality of signals.

Figure 3:
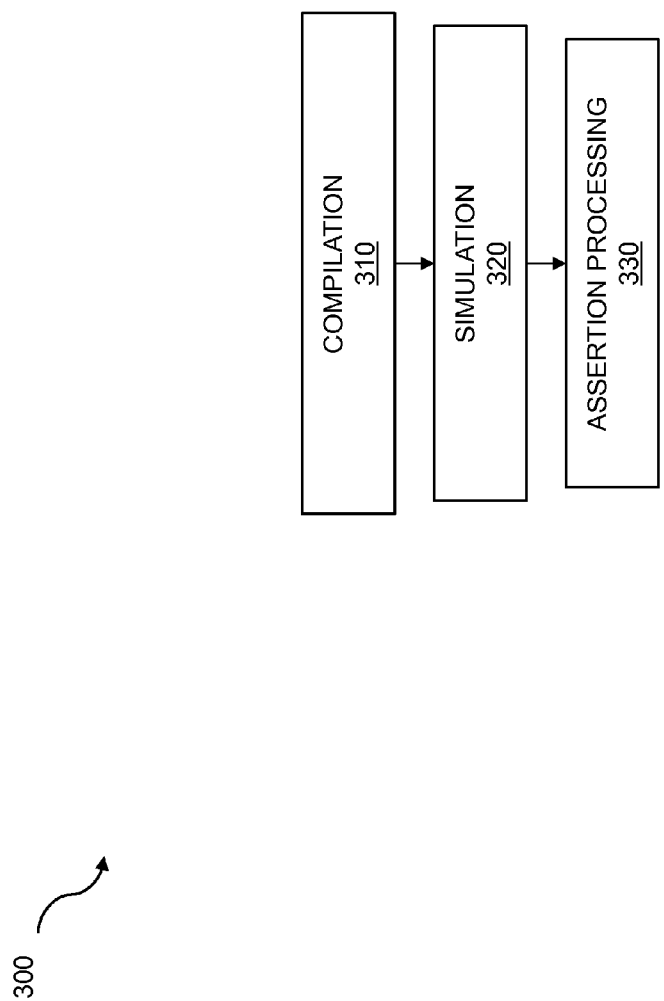
FIG. 3 is a simplified flow diagram for assertion generation.

FIG. 3 is a simplified flow diagram for assertion generation. A computer based method for assertion generation includes three phases as represented by the flow 300. The flow 300 includes a first phase, compilation 310; a second phase, simulation 320; and a third phase, assertion processing 330.

The first phase, compilation 310, includes static analysis and design instrumentation. For static analysis, the user specifies one or more modules from within the design under consideration for which assertion generation is requested. The design is compiled and the modules are translated to a word-level netlist. Groups of signals are then identified within the netlist where each group has one or more dependent signals and a set of independent signals that can have impact the value of the dependent signals.

During the second phase, simulation 320, various techniques can be used to exercise the design. So, the flow 300 includes simulating the circuit, including the groups of signals, across multiple tests. In some embodiments, the signal values generated during the simulation are dumped into a database file as tables. A table is an image of the relationship that exists between the dependent and independent signals with memory depth bounded by a sequential depth (SD). In embodiments, only one database file exists for each simulation run, and multiple simulation runs can be performed, thus leading to multiple database files.

During assertion processing 330, the third phase, databases are merged and properties extracted, filtered, and categorized. After databases are merged, they are uniquified to remove redundant information, in at least some embodiments. To extract properties, or assertions, the signal values in the merged table for each signal group are analyzed to extract temporal relations between the signal values. The temporal relations can then be expressed as assertions, which can be categorized as temporal assertions, temporal constraints, or temporal covers. The assertions can be filtered to reduce the number of assertions by removing redundant assertions and/or removing assertions that provide minimal value. The assertions, in at least some embodiments, are expressed as SystemVerilog assert, assume, or cover properties.

Figure 4:
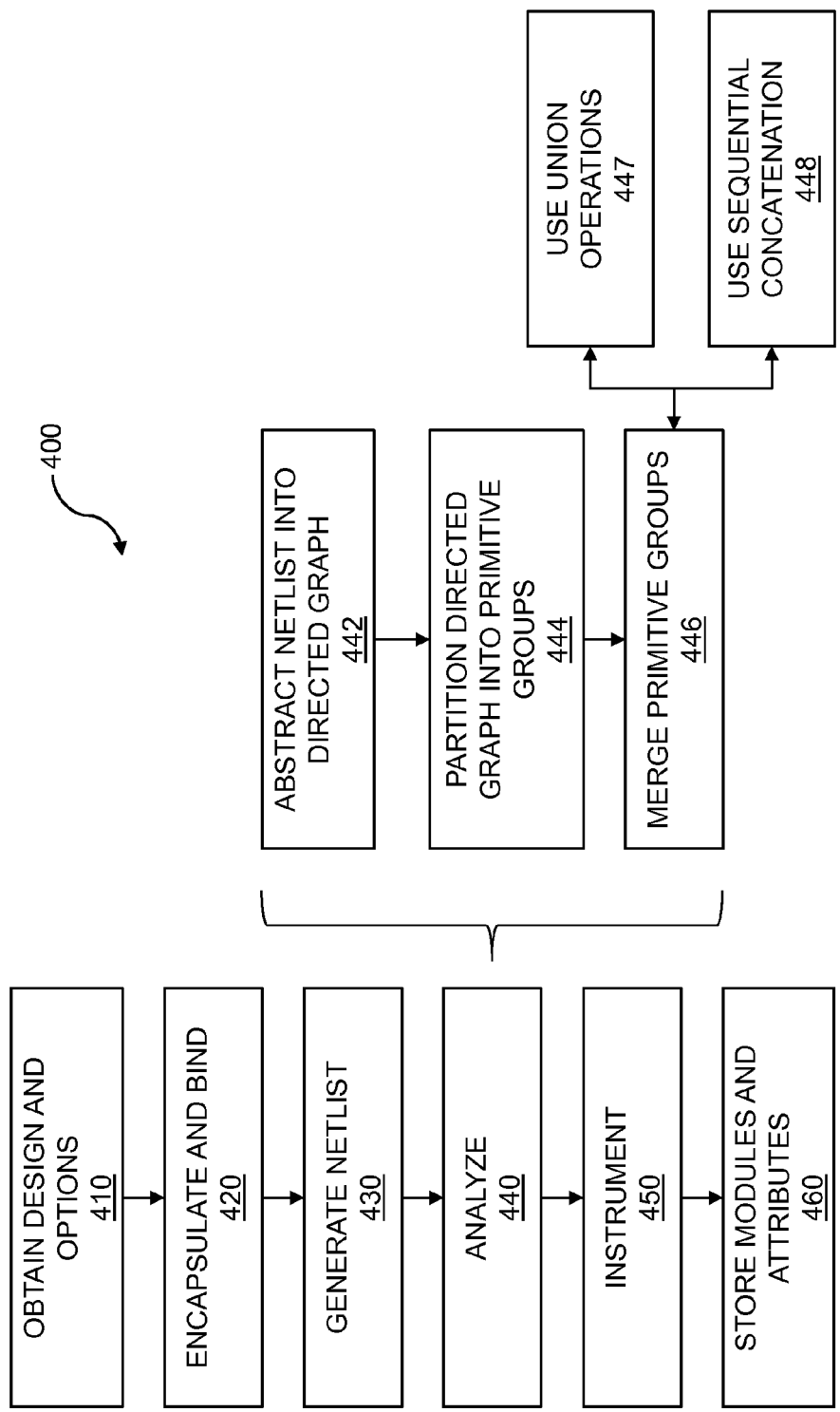
FIG. 4 is a flow diagram for compilation.

FIG. 4 is a flow diagram for compilation. The flow 400 shows a computer-implemented method for compilation and includes obtaining a design and options 410 for an electronic design. The design description can be obtained by any method, but is read from a computer readable medium in some embodiments. In other embodiments, the design description is obtained by user entry or from an output of another Electronic Design Automation (EDA) tool. The design description can take any form or be in any format, but the design description, in some embodiments, is a hardware description written using SYSTEMVERILOG™.

The flow 400 continues with encapsulating the appropriate assertion directives in files that include a module or vunit binding 420 to a corresponding design module. A netlist is generated 430 from a design description. The netlist includes signals identified by signal names and provides connectivity between various components including, for example, gates, registers, multiplexors, and so on.

The netlist in analyzed 440 to identify groups of signals. In some embodiments, the analyzing includes abstracting the netlist into a directed graph 442. The directed graph is then partitioned into primitive groups 444 that include a single dependent signal and a set of independent signals that can affect the dependent signal. The primitive groups can then be merged 446 into merged groups of signals. So the flow 400 includes merging a first group of signals with a second group of signals to form a merged group.

In some cases the primitive groups are merged using union operations 447, also called union merge and described above. In some embodiments, a union of the first group of signals and the second group of signals is performed to form the merged group, wherein the first group of signals and the second group of signals share at least two common independent signals.

In some cases, the primitive groups are merged using sequential concatenation 448, also known as sequential merge and described above, where one of more of the independent signals of a primitive group are replaced with the primitive group that drives the independent signal or signals, so the merging can include a sequential merge through a sequential depth. This can also be conceptualized as replacing one or more independent signals with a dependent signal. Merged groups can also be merged again in some embodiments. The size of the merged groups can be limited in some embodiments by the total number of independent signals in a group, and/or the sequential depth of the group. So, in some embodiments, the first group of signals and the second group of signals are sequentially merged, and the sequential depth of the merged group is less than a predetermined maximal sequential depth. One way of performing the sequential merge includes replacing an independent signal of the first group of signals with the second group of signals, wherein a dependent signal of the second group comprises the independent signal of the first group. In some embodiments, a temporal window size is determined.

The flow 400 can include instrumenting the design 450 for the dumping of the signal values. Instrumenting allows the values of signals to be accessed and stored as tables in a database during simulation or emulation. The results of the compilation phase are stored in modules with attributes 460. The modules and attributes are stored as files on computer readable media or in an electronic memory so that they can be accessed by the simulator or emulator.

Figure 5:
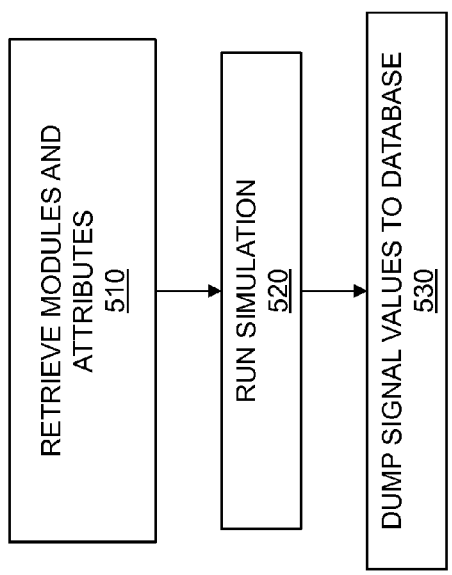
FIG. 5 is a flow diagram for simulation.

FIG. 5 is a flow diagram for simulation. The flow 500 shows a computer based method of simulating an electronic circuit. The flow 500 includes retrieving the modules and attributes 510 created by the compilation. The modules and attributes can be read from computer readable storage, memory, or obtained from another EDA tool. The flow 500 also includes running the simulation 520. Multiple runs of the simulation are performed to generate values for the instrumented signals in the design. During the simulation, the signal values are dumped to a database 530. In some embodiments, there is one database per run of the simulator. In other embodiments, different instrumentation within the design can dump data to different databases. In other embodiments, multiple runs of the simulator can dump data to the same database. The database can be formatted in any way, but in at least one embodiment, the database is formatted as a table of values with one row for each signal and one column for each clock of the simulation. In some embodiments, a temporal window having a sequential depth can be used during the dumping to dump data from the current clock and a number of previous clocks to the database, so that each independent signal has a number of values equal to the sequential depth dumped into the database for each clock cycle. The database(s) can be stored on computer readable media or in memory accessible for assertion processing.

Figure 6:
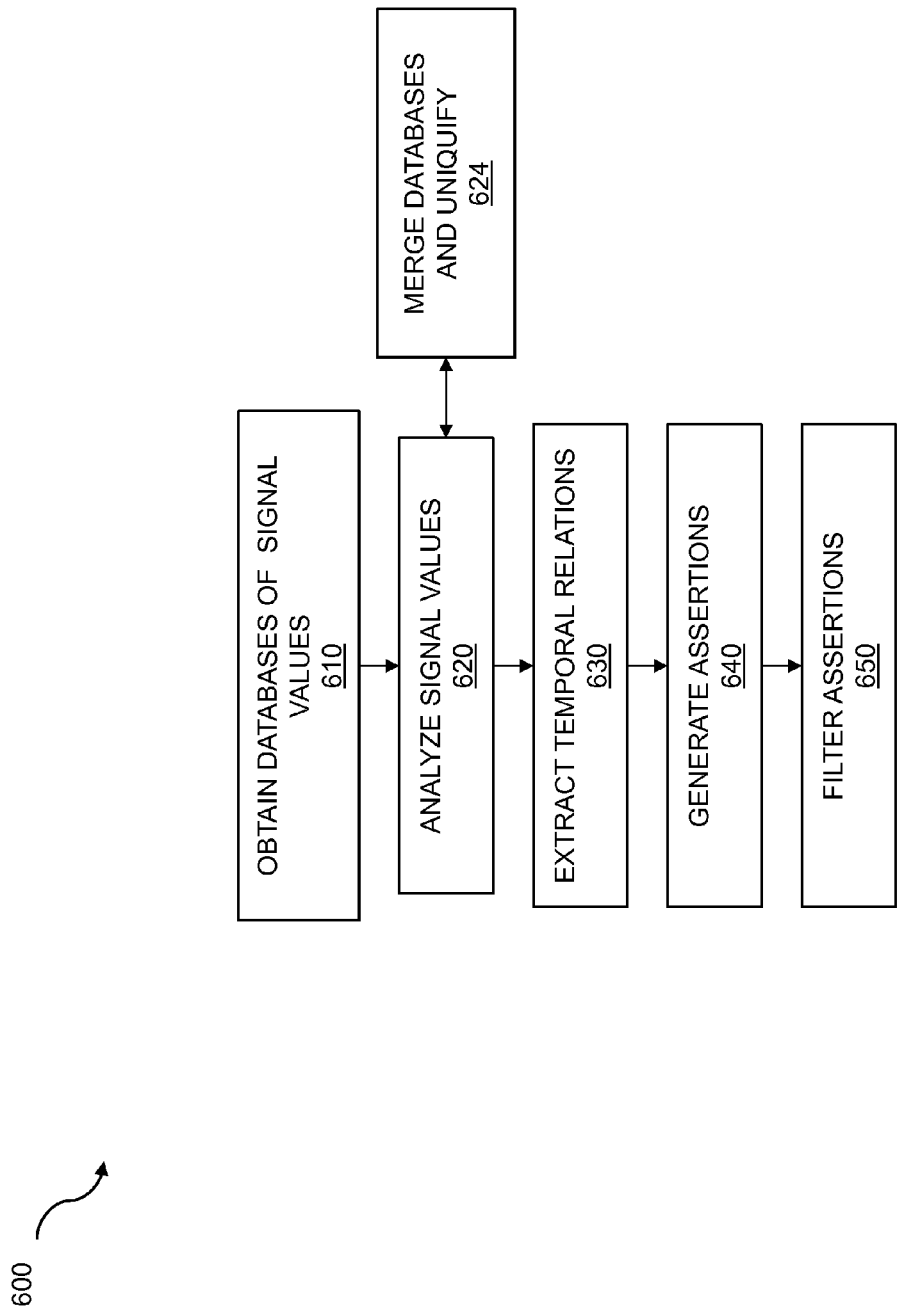
FIG. 6 is a flow diagram for assertion processing.

FIG. 6 is a flow diagram for assertion processing. The flow 600 describes a computer based method assertion processing. The flow 600 begins by obtaining databases of signal values 610. The databases can be obtained from computer readable media, memory, or from another EDA tool. In embodiments, the signal values are generated by one or more simulation runs of multiple clock cycles. The signal values of the database are then analyzed 620. If the temporal window was not used during the dumping, with each database containing only one column of data per clock, a temporal window size is obtained to determine how large of a temporal window to use during the analyzing. In some embodiments, the window size is three clocks or less. The temporal window traverses the table of values in the database to extract a number of values for each independent signal equal. The temporal window is passed "virtually" if the table data has been dumped during simulation. If the tables are formed by post-processing some complete dump files, e.g. VCD files, then the window would be passed over the data to extract the tables of values for each signal group. So, the temporal window can be used to successively generate a set of truth tables with a sequential depth of the window size, as will be shown in more detail in FIG. 7. The databases are also merged and uniquified 624. In some embodiments, the data from the databases is merged before the temporal window is used, but in other embodiments, the truth tables are generated using the temporal window from each database individually, with the truth tables merged afterwards. Once the merged truth table is created, it is uniquified to remove redundant data. So, the merging can result in uniquified tables where each vector of values appears exactly once.

The analyzing 620 includes removing signals from the tables if they do not have any impact on the dependent signals. Other analyzing can also be performed, depending on the embodiment. Temporal relations are extracted 630 from the signal values. Various techniques can be used for the extracting, but a minimal set of relations can be determined to describe the behavior shown by the signal values, in some embodiments. Assertions are generated 640 from the temporal relations, such as temporal assertions, temporal constraints, and temporal covers. In some embodiments, the plurality of assertions based on the relationships which were extracted can be selected. The selecting can be for saving the assertion or for removing the assertion. The flow 600 can further comprise filtering assertions 650. Any type of filtering can be performed to select, remove, or combine assertions.

Figure 7:
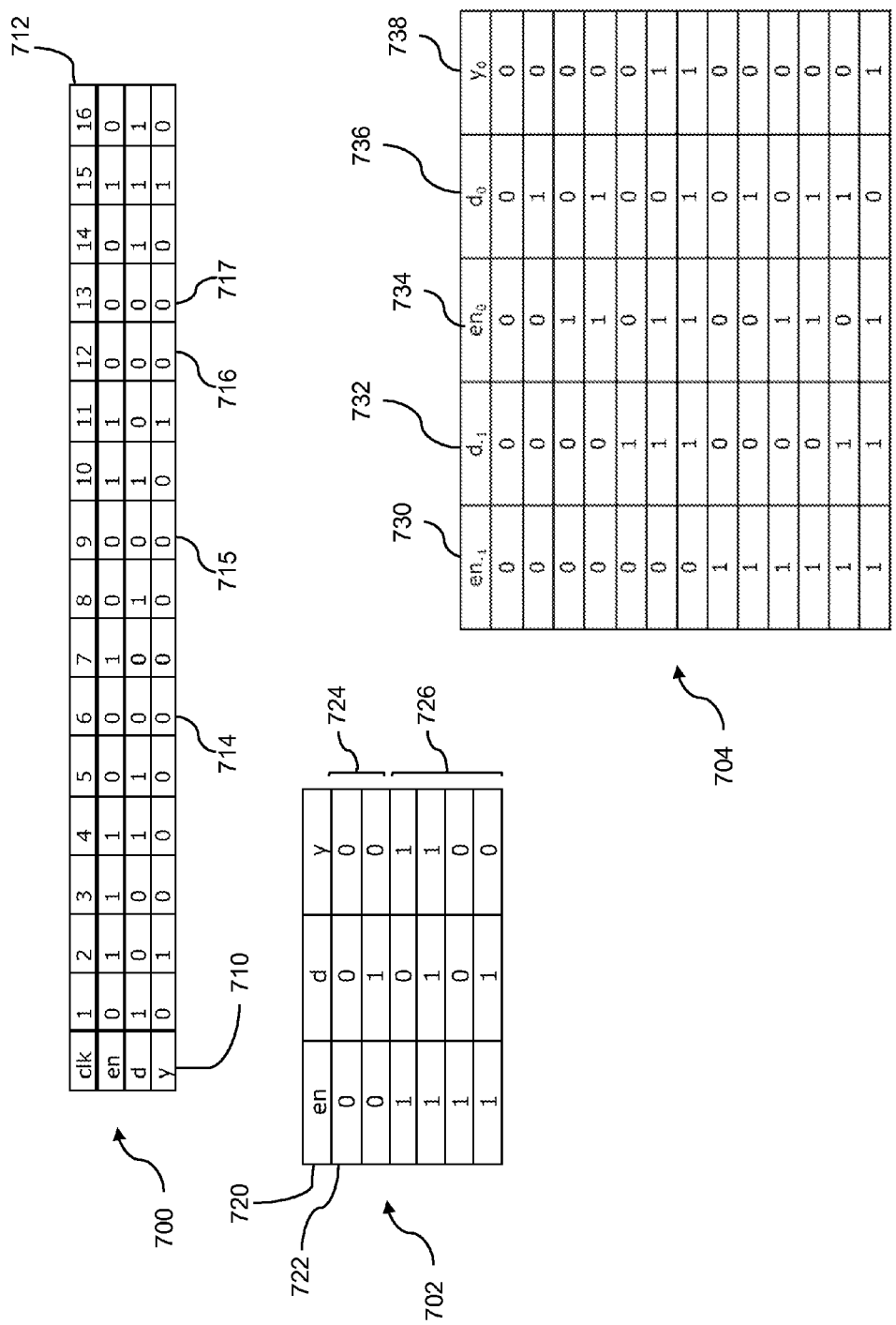
FIG. 7 shows tables for variable values.

FIG. 7 shows tables for various values. The table 700 shows values for three signals over 16 clock cycles. The three signals 710 comprise two independent signals, en and d, and one dependent signal, y, identified during the analysis phase. The individual clock cycles 712 are numbered 1-16 and the values in the rows of the table represent the values of a signal over the 16 clock cycles. One or more simulations are performed and data from those simulations dumped into the table 700. In some embodiments, multiple simulations are run with a table created for each simulation and then the signal data from the multiple simulations merged so that the data from the multiple tables are merged into a single table.

A sliding temporal window is then applied to the values in the first table 700 or the same can be achieved by dumping only the uniquified values during simulation. If a sliding window with a sequential depth of one clock cycle is used (SD=1), then each column of the first table 700 can be used to create a row in a truth table for the three signals having three columns, which can generate redundant information. For example the sixth clock 714, the ninth clock 715, the twelfth clock 716 and the thirteenth clock 717 all contain a value of 0 for all three signals. If the table generated by the sliding one-cycle clock is then uniquified to remove redundant rows, then the second table 702 is created with three columns, one for each of the three signals 720. The single row 722 is all that remains after uniquification to represent the four columns 714-717 that had three zeros in the first table 700. The uniquified second table 702 of this example has the six different combinations of values that are shown in the 16 columns of the first table 700. Note that there are two possible combinations of values ('001' and '011') that are not found in a column of the first table 700, and are therefore not found in a row of the second table 702.

Some relationships between the signals can be extracted from the second table 702. Notice that the behavior of y cannot be described by a function y=f(en, d) because the last four rows 726 do not uniquely determine the value of y. However, the first two rows 724 both uniquely define the value of y to be 0. The sub-relation consisting of these two rows represents a partial machine that can be converted to a valid property of the design: If en is 0 and d is 0 or 1 then y is 0. This can be expressed in SYSTEMVERILOG™ notation as: !en|→!y.

If a sliding window two clock cycles deep (SD=2) is used over the first table 700, the resulting uniquified third table 704 contains five columns, one column 738 for the dependent signal y during the current clock ($y_0$), one column 736 for the independent signal d during the current clock ($d_0$), one column 734 for the independent signal en during the current clock ($en_0$), one column 732 for the independent signal d during the previous clock ($d_{-1}$), and one column 730 for the independent signal en during the previous clock ($en_{-1}$). A subscript is used on the independent variables to refer to the number of earlier clock cycles. As the temporal depth of the sliding window increases, so does in general the size of the table. So, for practical reasons, some embodiments limit the depth to SD=3 clock cycles. This allows for the generation of properties that span up to 3 clock cycles.

Figure 8:
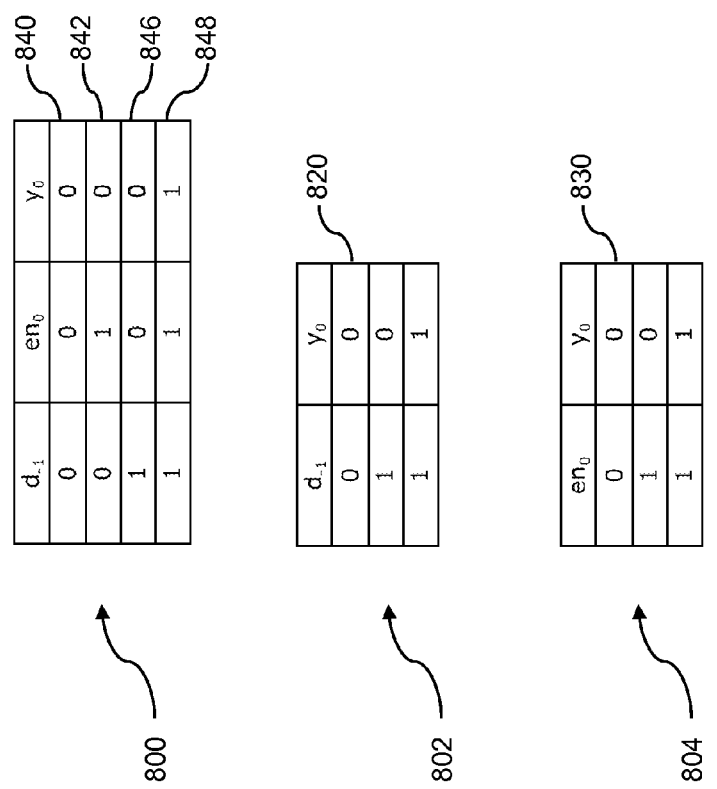
FIG. 8 shows further tables for variable reductions.

FIG. 8 shows further tables for variable values. The tables 800, 802, and 804, are extracted from the third table 704 from FIG. 7, which represents values with a sequential depth of two clock cycles, and represents a functional relation as a whole. Each row of values of ($en_{-1}$, $d_{-1}$, $en_0$, $d_0$) uniquely determines the value of $y_0$. However, the third table 704 may contain redundant information because not all the variables need to be included to determine the value of y. For example, if the variables $en_{-1}$ and $d_0$ are removed by deleting their corresponding columns (columns 730 and 736) from the third table 704, the fourth table 800 is created after uniquification. The fourth table 800 can be represented by a total function $y_0=f(d_{-1}, en_0)$, as all combinations of are ($d_{-1}$, $en_0$) represented and the value of $y_0$ is uniquely determined by ($d_{-1}$, $en_0$).

The process can be carried further by abstracting out either $d_{-1}$ or $en_0$ from the fourth table 800 (achieved by deleting the corresponding column in the table 800). Abstracting out $en_0$ yields the fifth table 802. The only functional sub-relation that can be extracted from the fifth table 802 is represented by the first row 820. The temporal relation can be expressed as: If the previous value of d was 0 then the current value of y is 0. That is, in SYSTEMVERILOG™ notation, !d|=>!y. Abstracting out $d_{-1}$ from the fourth table 800 yields the sixth table 804, after uniquification. The only functional sub-relation that can be extracted from the sixth table 804 is represented by the first row 830. The resulting property can be expressed in SYSTEMVERILOG™ notation as !en|→!y.

Notice that the two properties that were extracted from the fifth table 802 and the sixth table 804 do not describe conditions under which y equals 1. They only partially cover the original third table 704 and the reduced version of the fourth table 800. The sub-relations represent the first row 840, the second row 842, and the third row 846 of the fourth table 800. The fourth row 848 can be expressed in SYSTEMVERILOG™ notation as: d ##1 en|→y. In this example the set of extracted assertions—!d|=>!y, !en|→!y, d ##1 en|→y—completely represents the original reduced uniquified fourth table 800. In fact these assertions cover completely the table 704. Because the tables 702, 704, 800, 802, and 804 were, in this example, created by merging the results from multiple simulations and relationships are extracted from the tables 702, 704, 800, 802, 804, relationships between signals can be based on the merging of the signal data.

The entire original third table 704 could have been used to describe the behavior, but by choosing appropriate variables and checking the table coverage, the behavior can be described in a more compact way using 3 simple assertions. For each signal group that has a uniquified table associated with it, a complete set of functional sub-relations can be extracted and a covering problem solved, guided by a cost function. Since the complexity of the procedure grows exponentially with the number of variables allowed in a sub-relation (after abstraction), the maximum number of variables that can appear in such a relation, as well as the sequential depth, can be limited. This means that it may not be possible to obtain 100% coverage of the original table. But, in some embodiments, the trade-off is improved usability of the results because assertions that involve more than three or four variables over several clock cycles become much more difficult to understand by the design and verification engineers.

FIG. 9 shows code description of abstractions. The variable definitions 900 describe the variables used in the abstraction. The expression Table represents a uniquified table of signal values of signal group SG. The expression IS represents a set of independent variables of SG. The expression NIndep represents a number of variables in IS. The expression FuncRel represents a set of functional sub-relations extracted from Table. The expression RCost represents a cost function used to evaluate the cost of a functional relation, and the expression Vars represents a set of subsets of independent variables from IS.

The code description 900 uses two For loops to generate all possible subsets of independent variables IS (except the entire set of IS). In the inner loop, the particular subset of IS is removed from the table of signal values Table and then functional sub-relations are extracted. The cost function RCost is used to select a minimal subset of those functional sub-relations to cover Table. In the embodiment shown, RCost is utilized outside of the inner loop, but other embodiments can utilize RCost inside of the processing loop(s). Also, in some embodiments, a relation that is needed to cover a row in a uniquified table is also kept regardless its cost. The minimal subset of those function sub-relations can then be used to form assertions. So, the description 900 can include generating a plurality of assertions for a plurality of signals from the groups of signals, based on the relationships which were extracted, where the assertions are based on operation of the circuit across multiple clock cycles.

Figure 10:
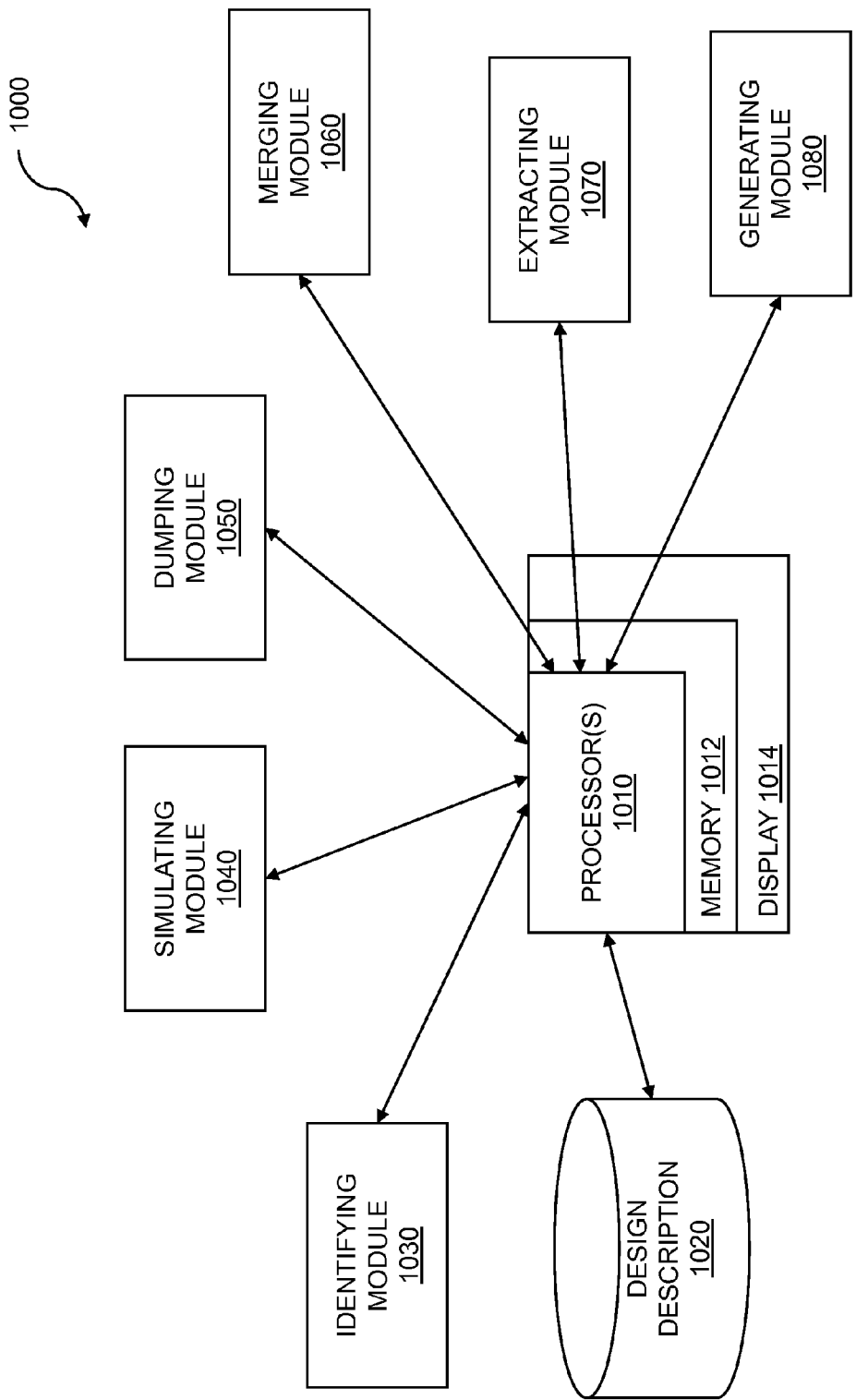
FIG. 10 is a system diagram for assertion extraction.

FIG. 10 is a system diagram for assertion extraction. The example system 1000 includes one or more processors 1010 coupled to memory 1012 which can be used to store computer code instructions and/or data, such as a design description for a circuit, groups of signals, databases, tables of signal values, simulation programs or other computer instructions, intermediate data, and the like. A display 1014 is also included in some embodiments, and can be any electronic display, including but not limited to, a computer display, a laptop screen, a net-book screen, a tablet screen, a cell phone display, a mobile device display, a remote with a display, a television, a projector, or the like. A design description 1020, which includes signals, is stored on a computer disk or other computer storage medium, where it can be obtained by the one or more processors 1010. A computer program running on the one or more processors 1010 is able to obtain the design description 1020 for a circuit and can store some or all of the design description 1020 in the memory 1012 for various periods of time. An identifying module 1030 is included in the system 1000 to identify groups of signals within the circuit, and a simulating module 1040 is included in the system 1000 to simulate the circuit, including the groups of signals, across multiple tests. A dumping module 1050 is included in the system 1000 to dump signal data, from the groups of signals, based on the simulating. A merging module 1060 is included in the system 1000 to merge the signal data from the multiple tests, and an extracting module 1070 is included in the system 1000 to extract relationships between signals based on the merging of the signal data. A generating module 1080 is included in the system 1000 to generate a plurality of assertions for a plurality of signals from the groups of signals, based on the relationships which were extracted, where the assertions are based on operation of the circuit across multiple clock cycles. In at least one embodiment, the functions of the identifying module 1030, the simulating module 1040, the dumping module 1050, the merging module 1060, the extracting module 1070, and/or the generating module 1080 are accomplished or augmented by the one or more processors 1010.

The system 1000 can include a computer program product embodied in a non-transitory computer readable medium for assertion generation comprising: code for obtaining a design description for a circuit; code for identifying groups of signals within the circuit; code for simulating the circuit, including the groups of signals, across multiple tests; code for dumping signal data, from the groups of signals, based on the simulating; code for merging the signal data from the multiple tests; code for extracting relationships between signals based on the merging of the signal data; and code for generating a plurality of assertions for a plurality of signals from the groups of signals, based on the relationships which were extracted, where the assertions are based on operation of the circuit across multiple clock cycles.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JAVASCRIPT™, ACTIONSCRIPT™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer program product embodied in a non-transitory computer readable medium, which when executed by a processor, causes the processor to perform assertion generation, the computer program product comprising instructions that when executed cause the processor to:
   identify groups of signal nets within a circuit based on a design description;
   simulate the circuit, including the groups of signals, across multiple tests;
   dump signal data, from the groups of signals, based on the simulating;
   extract relationships between signals based on the signal data that was dumped; and
   generate a plurality of assertions for a plurality of signals, from the groups of signals, based on the relationships which were extracted, wherein the plurality of assertions include temporal assertions, temporal constraints, and temporal covers.

2. The program product of claim 1 that further causes the processor to merge the signal data from the multiple tests.

3. The program product of claim 2 wherein extraction is further based on the merging of the signal data.

4. The program product of claim 3 wherein the plurality of assertions are based on operation of the circuit across multiple clock cycles.

5. The program product of claim 2 wherein dumping of signal data from the multiple tests is dumped into multiple tables where a table is dumped for a test.

6. The program product of claim 5 wherein merging of the signal data merges data from the multiple tables into a single table.

7. The program product of claim 1 wherein dumping of signal data provides uniquified information on the signal data.

8. The program product of claim 1 wherein temporal assertions include statements describing required relations between values of different signals that the circuit must satisfy over multiple clock cycles.

9. The program product of claim 1 wherein temporal assumptions include constraints expressing use environment limitations for interfaces of the circuit.

10. The program product of claim 1 wherein temporal covers include a measure quality of verification for the circuit by identifying those portions of the circuit that are exercised.

11. The program product of claim 1 that further causes the processor to determine a maximum sequential depth for the simulating.

12. The program product of claim 11 that further causes the processor to slide a temporal window, during the simulating, across the groups of signals where the temporal window is less than or equal to the maximum sequential depth.

13. The program product of claim 1 that further causes the processor to merge a first group of signals with a second group of signals to form a merged group of signals.

14. The program product of claim 13, wherein the first group of signals and the second group of signals are sequentially merged, and a sequential depth of the merged group of signals is less than a predetermined maximal sequential depth.

15. The program product of claim 14 wherein the sequential merge includes replacing an independent signal of the first group of signals with the second group of signals, wherein a dependent signal of the second group of signals comprises the independent signal of the first group of signals.

16. The program product of claim 13 wherein a union of the first group of signals and the second group of signals is performed to form the merged group of signals, wherein the first group of signals and the second group of signals share at least two common independent signals.

17. The program product of claim 16 wherein merging results in uniquified tables where each vector of values appears exactly once.

18. The program product of claim 1 wherein the relationships include a minimal functional relationship from truth tables.

19. The program product of claim 18 that further causes the processor to filter assertions based on the extracting of the minimal function relationship.

20. The program product of claim 19 wherein filtering is further based on a common predecessor for multiple signals from the plurality of signals.

21. The program product of claim 1 that further causes the processor to select from the plurality of assertions based on the relationships which were extracted.

22. The program product of claim 21 that further causes the processor to select one or more of the plurality of assertions for rejection.

23. The program product of claim 1 that further causes the processor to instrument the circuit for the dumping of signal values.

24. The program product of claim 1 that further causes the processor to use the plurality of assertions in a formal design check.

25. The program product of claim 1 wherein the plurality of assertions are based on value traces for the groups of signals within the circuit.

26. A computer system for assertion generation comprising:
   a memory which stores instructions;
   one or more processors coupled to the memory wherein the one or more processors are configured to:
      identify groups of signal nets within a circuit based on a design description;
      simulate the circuit, including the groups of signals, across multiple tests;
      dump signal data, from the groups of signals, based on the simulating;
      extract relationships between signals based on the signal data that was dumped; and
      generate a plurality of assertions for a plurality of signals, from the groups of signals, based on the relationships which were extracted, wherein the plurality of assertions include temporal assertions, temporal constraints, and temporal covers.

27. A computer-implemented method for assertion generation comprising:
   identifying groups of signal nets within a circuit based on a design description;
   simulating the circuit, including the groups of signals, across multiple tests;
   dumping signal data, from the groups of signals, based on the simulating;

extracting relationships between signals based on the signal data that was dumped; and generating, using one or more processors, a plurality of assertions for a plurality of signals, from the groups of signals, based on the relationships which were extracted wherein the plurality of assertions include temporal assertions, temporal constraints, and temporal covers.

28. The method of claim 27 further comprising merging the signal data from the multiple tests.

29. The method of claim 28 wherein the extracting is further based on the merging of the signal data and wherein the plurality of assertions are based on operation of the circuit across multiple clock cycles.

30. The method of claim 27 further comprising determining a maximum sequential depth for the simulating.

31. The method of claim 30 further comprising sliding a temporal window, during the simulating, across the groups of signals where the temporal window is less than or equal to the maximum sequential depth.

32. The method of claim 27 further comprising merging a first group of signals with a second group of signals to form a merged group of signals.

33. The method of claim 32, wherein the first group of signals and the second group of signals are sequentially merged, and a sequential depth of the merged group of signals is less than a predetermined maximal sequential depth.

34. The system of claim 26 further comprising merging the signal data from the multiple tests.

35. The system of claim 34 wherein the extracting is further based on the merging of the signal data and wherein the plurality of assertions are based on operation of the circuit across multiple clock cycles.

36. The system of claim 26 further comprising determining a maximum sequential depth for the simulating.

37. The system of claim 36 further comprising sliding a temporal window, during the simulating, across the groups of signals where the temporal window is less than or equal to the maximum sequential depth.

38. The system of claim 26 further comprising merging a first group of signals with a second group of signals to form a merged group of signals.

39. The system of claim 38, wherein the first group of signals and the second group of signals are sequentially merged, and a sequential depth of the merged group of signals is less than a predetermined maximal sequential depth.

\* \* \* \* \*